United States Patent
Oe et al.

(10) Patent No.: US 6,172,577 B1
(45) Date of Patent: Jan. 9, 2001

(54) OSCILLATOR AND OSCILLATION APPARATUS USING THE OSCILLATOR

(75) Inventors: Osamu Oe, Shiga-ken; Toshio Hata, Omihachiman; Teruhisa Tsuru, Kameoka, all of (JP)

(73) Assignee: Murata Manufacturing Co., Ltd., Nagaokakyo (JP)

( * ) Notice: Under 35 U.S.C. 154(b), the term of this patent shall be extended for 0 days.

(21) Appl. No.: 09/121,299

(22) Filed: Jul. 23, 1998

(30) Foreign Application Priority Data

Jul. 25, 1997 (JP) .................................................. 9-200110
Jul. 25, 1997 (JP) .................................................. 9-200111

(51) Int. Cl.$^7$ ....................................................... H03B 5/18
(52) U.S. Cl. ................. 331/117 D; 331/96; 331/107 SL; 331/177 V; 333/235
(58) Field of Search ................. 331/117 D, 107 SL, 331/107 DP, 96, 177 V; 333/109, 115, 116, 219, 235

(56) References Cited

U.S. PATENT DOCUMENTS 4,375,621 * 3/1983 Schneiter et al. ................. 331/117 D

FOREIGN PATENT DOCUMENTS

2084504 * 12/1987 (JP) .................................. 331/117 D

* cited by examiner

Primary Examiner—Arnold Kinkead
(74) Attorney, Agent, or Firm—Burns, Doane, Swecker & Mathis, LLP

(57) ABSTRACT

A small-sized oscillator which readily oscillates and an oscillation apparatus using same are described. In the oscillator, an oscillation transistor, such as a silicon bipolar transistor, is arranged on a dielectric substrate and a quarter-wave open-circuit terminal stub is connected to the base of the oscillation transistor. Also, the collector of the oscillation transistor is grounded through a capacitor. In addition, the emitter of the oscillation transistor is connected to the collector and base through feedback capacitors C1 and C2, respectively. In this case, the quarter-wave open-circuit terminal stub can be considered grounded from the standpoint of distributed constants, and accordingly, the oscillator is also grounded.

19 Claims, 5 Drawing Sheets

OSCILLATOR AND OSCILLATION APPARATUS USING THE OSCILLATOR

This application corresponds to Japanese Patent Application Nos. 9-200110 and 9-200111, both filed on Jul. 25, 1997, and both of which are hereby incorporated by reference in their entireties.

BACKGROUND OF THE INVENTION

1. Field of the Invention

The present invention relates to an oscillator and an oscillation apparatus using the oscillator. More specifically, this invention relates to a base-grounded or gate-grounded oscillator with a quarter-wave open-circuit terminal stub connected to the base or gate of a transistor and an oscillation apparatus using the oscillator.

Furthermore, the present invention relates to an oscillation apparatus, and more particularly relates to an oscillation apparatus with an oscillator and a resonator both of which are magnetically coupled.

2. Description of the Related Art

A conventional oscillator using a dielectric resonator has a circuit configuration shown in FIG. 7, for example. The oscillator 50 shown in FIG. 7 is called a band reflection type oscillator. In this type of oscillator, a transistor 51 for oscillation, such as a silicon bipolar transistor, is arranged on, for example, a dielectric substrate (not illustrated), and a stripline 52 is connected to the base. To the stripline 52, a DC cut-off capacitor 53 and a terminating resistance 54 are connected in series. Moreover, a dielectric resonator 55 is arranged in the vicinity of the stripline 52, and the arrangement causes the stripline 52 to be magnetically coupled to the dielectric resonator 55. Further, the collector of the oscillation transistor 51 is grounded. Also, the emitter of the oscillation transistor 51 is connected to the collector and base via respective capacitors. Here, the terminating resistor 54 functions to eliminate unwanted oscillation except the resonance frequency of the dielectric resonator 55. In addition, the internal and stray capacitance of the oscillation transistor 51 can be substituted for the capacitance between the emitter and collector and between the emitter and base of the oscillation transistor 51 shown in FIG. 7, and accordingly those capacitors are not generally formed as external components.

The oscillator 60 shown in FIG. 8 is called a reflection type of oscillator, in which an oscillation transistor 51, such as a silicon bipolar transistor, is arranged on, for example, a dielectric substrate (not illustrated). To the base of the transistor, a half-wave open-circuit terminal stub 61 is connected. Also, the collector of the oscillation transistor 51 is grounded. Further, the emitter of the oscillation transistor 51 is connected to the collector and the base via respective capacitors.

In addition, the internal and stray capacitance of the oscillation transistor 51 can be substituted for the capacitance between the emitter and collector and between the emitter and base of the oscillation transistor 51 shown in FIG. 8. As such, these capacitors are generally not formed as external components.

SUMMARY OF THE INVENTION

The above-mentioned conventional oscillator using a dielectric resonator provides oscillation by means of the resonance at a specific frequency of the dielectric resonator and has been well-utilized in a high-frequency zone. However, one problem is that this oscillator is made oversized (e.g., large-sized) because the dielectric resonator is large and a metal case is required to cut off the magnetic flux from the dielectric resonator.

Moreover, the conventional oscillator using a half-wave open-circuit terminal stub has problems in that the oscillator is large-sized because of the use of the half-wave open-circuit terminal stub. As such, the C/N representing the ratio of the output voltage (Carrier) to the noise power (Noise) in the vicinity of the oscillation frequency cannot be increased as high as that of an oscillator using a dielectric resonator.

The present invention has been made to solve at least such problems and to present a small-sized oscillator which easily oscillates, and an oscillation apparatus using such an oscillator.

The present invention also pertains to an oscillation apparatus which is small-sized and has a high C/N ratio.

In order to solve the above-mentioned problems, the present invention comprises an oscillation transistor, a quarter-wave open-circuit terminal stub connected to the base or gate of the oscillation transistor, and a capacitor having a resonance frequency lower than the oscillation frequency connected to the collector or drain of the oscillation transistor.

Further, the present invention is characterized in that a high-impedance line is connected in series with the capacitor.

Further, the present invention is characterized in that the oscillator and a resonator having the quarter-wave short-circuit terminal stub are magnetically coupled.

The present invention, furthermore, comprises an oscillator made up of an oscillation transistor and an open-circuit terminal stub connected to the base or gate of the oscillation transistor, and a resonator composed of a quarter-wave short-circuit terminal stub. The oscillator and the resonator both are magnetically connected together.

The oscillator according to the present invention can be made small-sized because the oscillator consists of an oscillator, a quarter-wave open-circuit terminal stub, and a capacitor.

Also, the oscillation apparatus according to the present invention can make a resonator resonate under nearly no-load conditions because the magnetic coupling of an oscillator and the resonator causes the oscillator and the resonator to resonate with each other.

BRIEF DESCRIPTION OF THE DRAWINGS

The foregoing and other objects, features and advantages of the present invention will be more readily understood upon reading the following detailed description in conjunction with the drawings in which.

DESCRIPTION OF THE PREFERRED EMBODIMENT

In the following, the exemplary embodiments of the present invention are explained with reference to the drawings.

Figure 1:
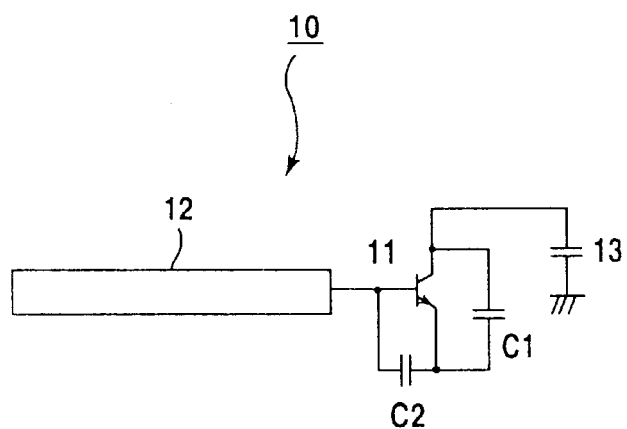
FIG. 1 is a circuit configuration of the exemplary first embodiment relating to the oscillator of the present invention.

FIG. 1 is the circuit configuration of the first embodiment of the oscillator according to the present invention. In the oscillator 10, an oscillation transistor 11, such as a silicon bipolar transistor, is arranged on, for example, a dielectric substrate (not illustrated), and a quarter-wave open-circuit terminal stub 12 is connected to the base of the oscillation transistor 11.

Also, the collector of the oscillation transistor 11 is grounded through a capacitor 13. Further, the emitter of the oscillation transistor 11 is connected to the collector and the base through feedback capacitors C1 and C2, respectively.

Furthermore, the quarter-wave open-circuit terminal stub 12 can be considered grounded from the standpoint of distributed constants, and accordingly, the oscillator 10 is base-grounded. Also, the quarter-wave open-circuit terminal stub is made up of a stripline or microstripline.

In addition, the capacitor 13 has a resonance frequency lower than the oscillation frequency $f_0$ of the oscillator 10. Moreover, the internal and stray capacitance of the oscillation transistor 11 can be substituted for the feedback capacitors C1 and C2 between the emitter and collector and between the emitter and base of the oscillation transistor 11, respectively. This is because feedback capacitors C1 and C2 having a very small capacitance suffice, for example, at the high frequencies (e.g., around 6 GHz) at which the oscillator can be used. Accordingly, these capacitors are not generally attached as external components.

In the above construction, the capacitor 13 functions as a component of inductance beyond the resonance frequency $f_r$, and the oscillator 10 becomes a Colpitts-type oscillator. Therefore, the oscillator 10 starts to generate oscillation at a frequency where the composite reactance of a component of inductive reactance of the quarter-wave open-circuit terminal stub 12 and the capacitor 13 and a component of capacitive reactance of the feedback capacitors C1 and C2 becomes equal to zero. More specifically, the oscillation frequency $f_0$ is expressed by the following relationship, where the composite inductance of the quarter-wave open-circuit terminal stub 12 and the capacitor 13 is L:

$$2\pi f_0 = 1/(L(C1+C2))^{1/2}$$

Figure 2:
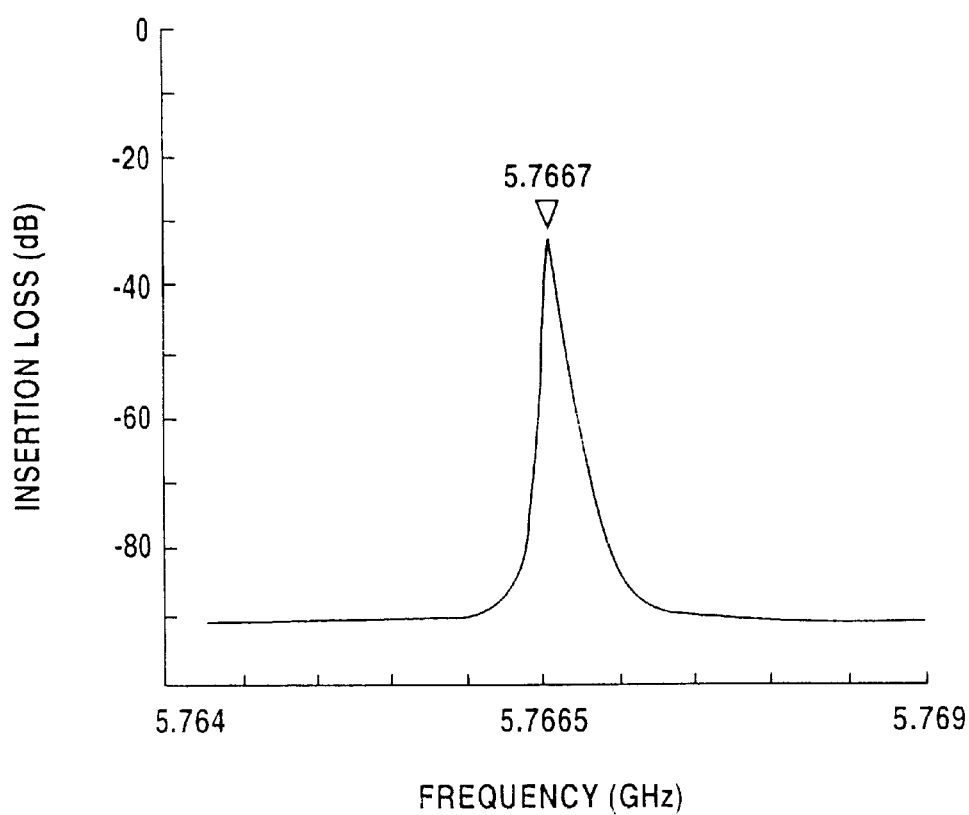
FIG. 2 shows the frequency characteristic of the oscillator in FIG. 1.

In FIG. 2, the frequency characteristic is shown. From the diagram, it is understood that the oscillator 10 generates oscillation at the frequency of approximately 5.7667 GHz.

Based on the above-mentioned first embodiment, the oscillator comprises a bipolar transistor or field-effect transistor, a quarter-wave open-circuit terminal stub, and a capacitor, and accordingly, the oscillator is able to be made small-sized.

Further, as the capacitor has a resonance frequency lower than the oscillation frequency, the capacitor functions as a component of inductance beyond the resonance frequency, and as a result, the oscillator becomes a Colpitts-type oscillator. Therefore, it becomes possible to easily generate oscillation at the frequency where the composite inductance of the oscillator equals zero.

Figure 3:
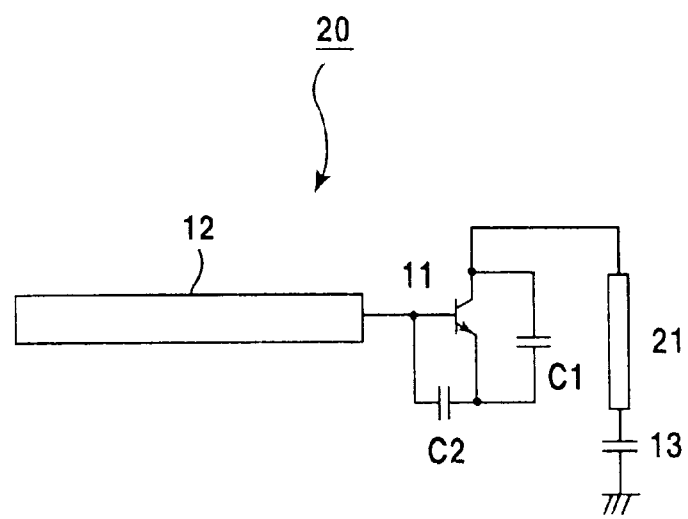
FIG. 3 is a circuit configuration of the second exemplary embodiment relating to the oscillator of the present invention.

FIG. 3 shows the circuit configuration of the second embodiment of the oscillator relating to the present invention. The oscillator 20 differs from the oscillator 10 (FIG. 1) of the first embodiment in that a high-impedance line 21 is added in series with the capacitor 13 connected between the collector of the transistor 11 and the ground.

Based on the above-described second embodiment, the adjustment of the length of the high-impedance line 21 makes it easier to optimize the composite impedance of the quarter-wave open-circuit terminal stub 12, the capacitor 13, and the high-impedance line 21 in comparison with the oscillator 10 of the first embodiment. Therefore, the adjustment of the oscillation frequency $f_0$ of the oscillator 20 is simplified.

Figure 4:
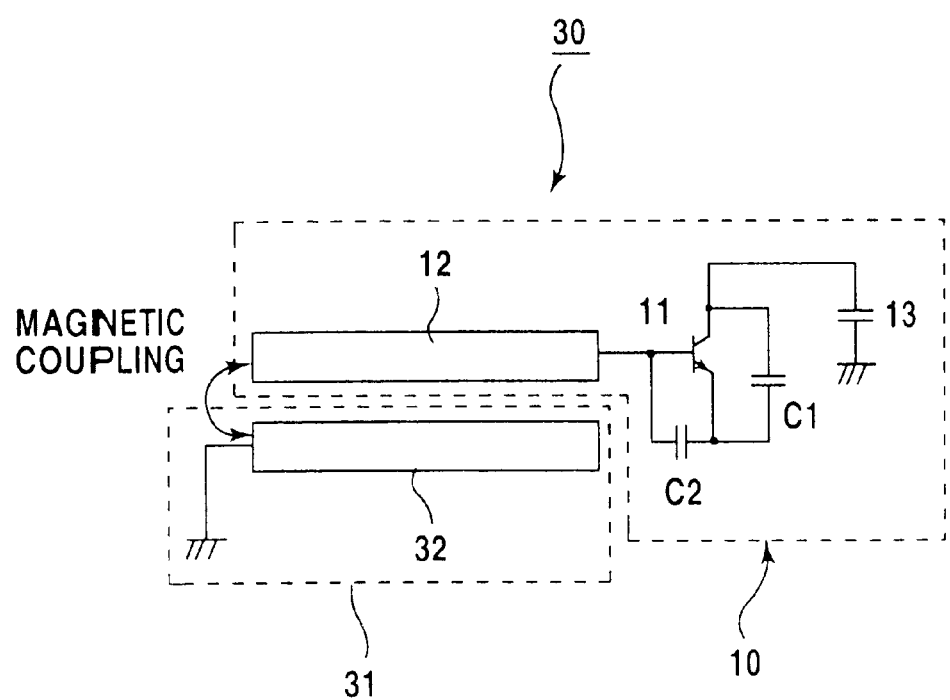
FIG. 4 is a circuit configuration of a third exemplary embodiment, relating to the oscillation apparatus of the present invention.

FIG. 4 shows the circuit configuration of a third embodiment, comprising an oscillation apparatus relating to the present invention. The oscillation apparatus 30 comprises an oscillator 10 (FIG. 1) and a resonator 31.

The resonator 31 comprises a quarter-wave short-circuit terminal stub 32. Also, the magnetic coupling of the quarter-wave open-circuit terminal stub 12 of the oscillator 10 and the quarter-wave short-circuit terminal stub 32 of the resonator 31 results in the coupling of the oscillator 10 and the resonator 31. The quarter-wave short-circuit terminal stub 32 can comprise a stripline or microstripline.

Figure 5:
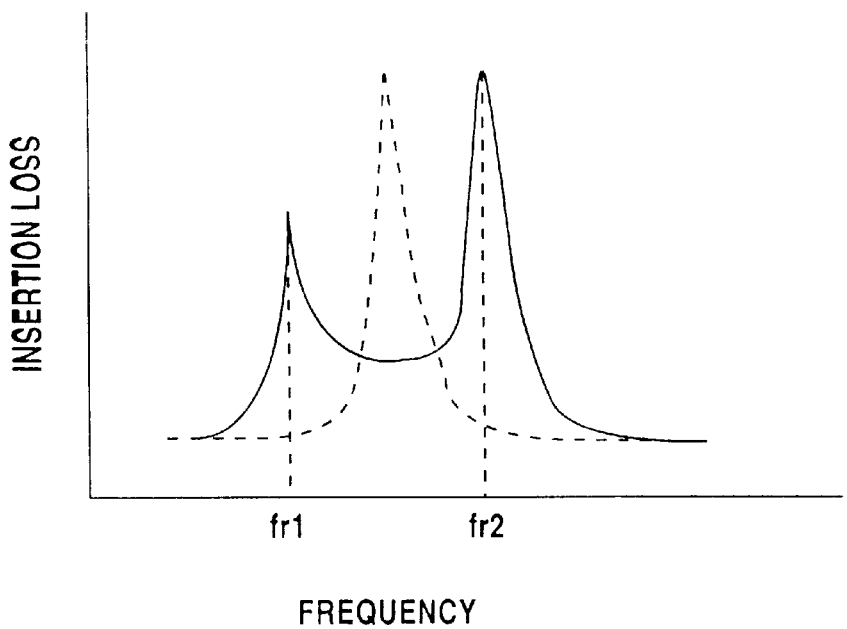
FIG. 5 shows the frequency characteristic of the oscillation apparatus in FIG. 4.

Based on the above construction, the oscillator 10 and the resonator 31 are magnetically coupled, and the oscillator 10 and the resonator 31 resonate with each other because of the magnetic coupling. Accordingly, the oscillation apparatus 30 has two resonance frequencies $f_{r1}$ and $f_{r2}$ as shown in FIG. 5. For comparison, the characteristic of the oscillator 10 is shown in broken line.

These resonance frequencies $f_{r1}$ and $f_{r2}$ change depending on the strength of the magnetic coupling between the oscillator 10 and the resonator 31, and the oscillation apparatus 30 generates oscillation at either frequency of the resonance frequencies $f_{r1}$ and $f_{r2}$. Therefore, the oscillation frequency of the oscillation apparatus 30 can be easily altered by changing the strength of the magnetic coupling between the oscillator 10 and the resonator 31.

Also, the magnetic coupling of the oscillator 10 and the resonator 31 makes the oscillator 10 and the resonator 31 resonate with each other, and accordingly the resonator 30 can be made to resonate under nearly no-load conditions. As a result, the C/N defined as the ratio of the output voltage (Carrier) to the noise voltage (Noise) in the vicinity of the oscillation frequency can be improved.

That is, according to an experiment, the oscillation apparatus 30 exhibited −90.8 dB as the C/N at the resonance frequency of 6 GHz, which is improved as much as 2.5 dB in comparison with −88.3 dB, which is the C/N for the oscillator 10 (FIG. 1).

According to the above-mentioned third embodiment, the oscillation frequency of the oscillation apparatus can be controlled in such a way that the oscillator and the resonator are made to magnetically couple and the intensity of the magnetic coupling is changed.

Also, the resonator can be made to resonate under nearly no-load conditions, and consequently it is possible to improve the C/N ratio of the oscillation apparatus, which leads to the realization of a higher C/N ratio.

The oscillator 20 of FIG. 3 can be used in place of the oscillator 10 in the FIG. 4 embodiment.

Figure 6:
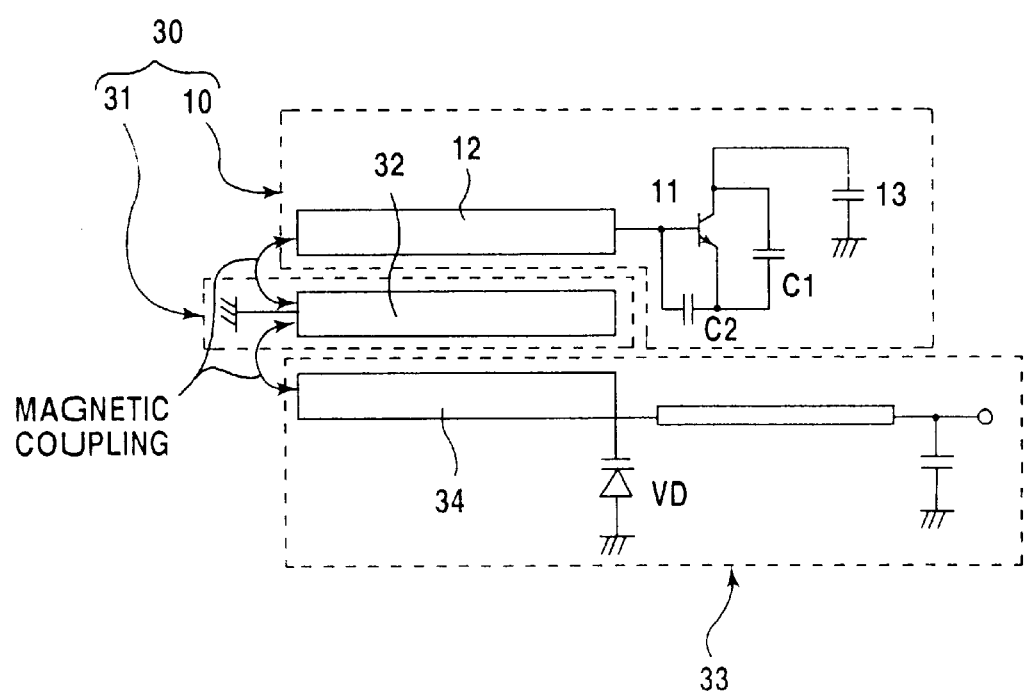
FIG. 6 is a circuit configuration of the oscillation apparatus in FIG. 4 applied to a voltage-controlled oscillator.
Figure 7:
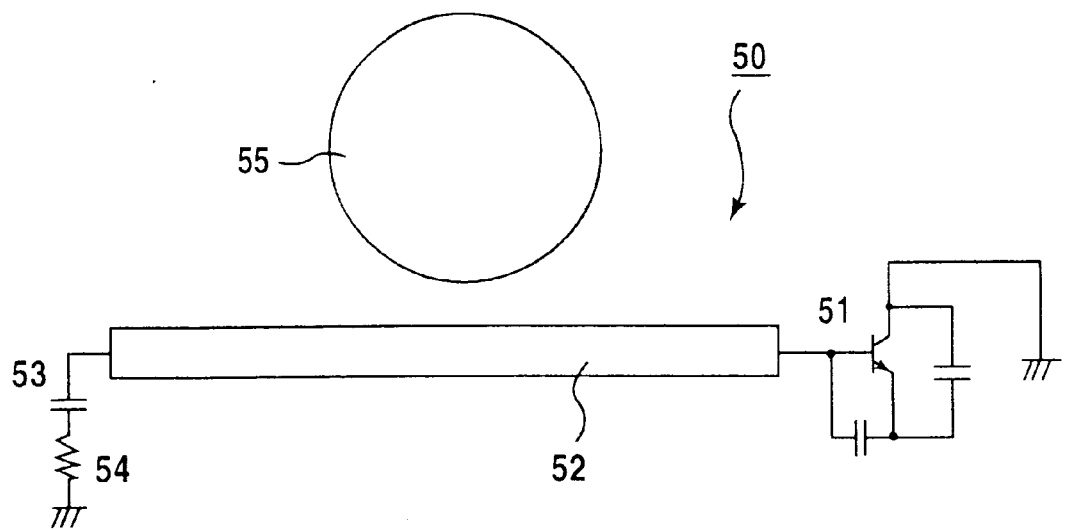
FIG. 7 shows a circuit configuration of a conventional oscillator.
Figure 8:
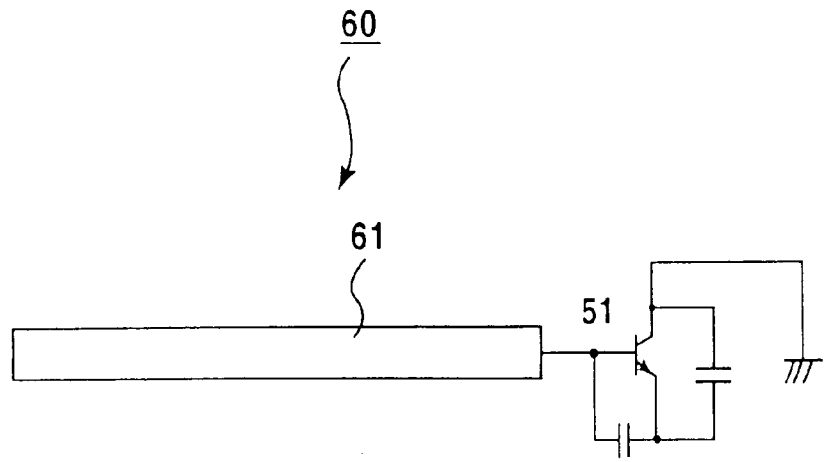
FIG. 8 is a circuit configuration of another conventional oscillator.

As shown in FIG. 6, a quarter-wave open-circuit terminal stub 34 is provided as a component of an oscillation frequency regulating circuit 33. The quarter-wave open-circuit terminal stub 34 magnetically couples with the quarter-wave short-circuit terminal stub 32 of the resonator 31. A capacitance component of the oscillation frequency regulating circuit is controlled by a varactor diode VD. In this varactor element, the capacitance varies with the applied voltage, thereby controlling the strength of the magnetic coupling of the oscillator 10 and the resonator 31, making it possible to regulate the oscillation frequency by the applied voltage, which can be applied to a voltage-controlled oscillator.

Further, in the first through the third embodiments, bipolar transistors were used for the transistors 11, but even if a field-effect transistor is used, the same effect can be obtained.

Furthermore, in the third embodiment, magnetic coupling is provided using a quarter-wave open-circuit terminal stub and a quarter-wave short-circuit terminal stub, but a plurality of quarter-wave open-circuit terminal stubs and quarter-wave short-circuit terminal stubs can be used, for example, to provide a magnetically coupled comb-like configuration. In this embodiment, three or more resonance frequencies can be produced and the stability of the resonance frequencies is increased.

Moreover, a varactor diode was used in the above exemplary embodiments as the element of voltage-variable capacitance. Also, however, a PIN diode, transistor, or like device can be used to provide a like effect in the voltage-controlled oscillator.

Moreover, an oscillator formed on a material of voltage-variable dielectric constant can be applied to the voltage-controlled oscillator.

Returning now to the discussion of FIG. 4, as mentioned, this figure shows an oscillator apparatus 30, which comprises an oscillator 10 and a resonator 31.

In the oscillator 10, an oscillation transistor 11 such as a silicon bipolar transistor, is arranged on, for example, a dielectric substrate (not illustrated), and a quarter-wave open-circuit terminal stub 12 comprising the open-circuit terminal stub is connected to the base of the oscillation transistor.

Also, the collector of the oscillation transistor 11 is grounded through a capacitor 13, and the emitter of the oscillation transistor 11 is connected to the collector and base through feedback capacitors C1 and C2, respectively.

The resonator 31 comprises a quarter-wave short-circuit terminal stub 32. Also, the magnetic coupling of the quarter-wave open-circuit terminal stub 12 of the oscillator 10 and the quarter-wave short-circuit terminal stub 32 of the resonator 31 results in the magnetic coupling of the oscillator 10 and the resonator 31.

In this case, the quarter-wave open-circuit terminal stub 12 of the oscillator 10 which is grounded from the standpoint of distributed constants, becomes an earth wire. That is, the oscillation apparatus 30 comprises the quarter-wave short-circuit terminal stub 32 of the resonator 31 magnetically coupled to the earth wire of the oscillator 10.

Also, the quarter-wave open-circuit terminal stub 12 of the oscillator 10 and the quarter-wave short-circuit terminal stub 32 of the resonator 31 comprise a stripline or a microstripline. Further, the internal and stray capacitance of the oscillation transistor 11 can be substituted for the feedback capacitance C1 and C2 between the emitter and collector and between the emitter and base, respectively, of the oscillation transistor 11. This is because very small feedback capacitances C1 and C2 suffice at, for example, a high frequency (e.g., around 6 GHz) where the oscillator 30 is used, and accordingly the capacitances are not generally formed using external components.

Figure 9:
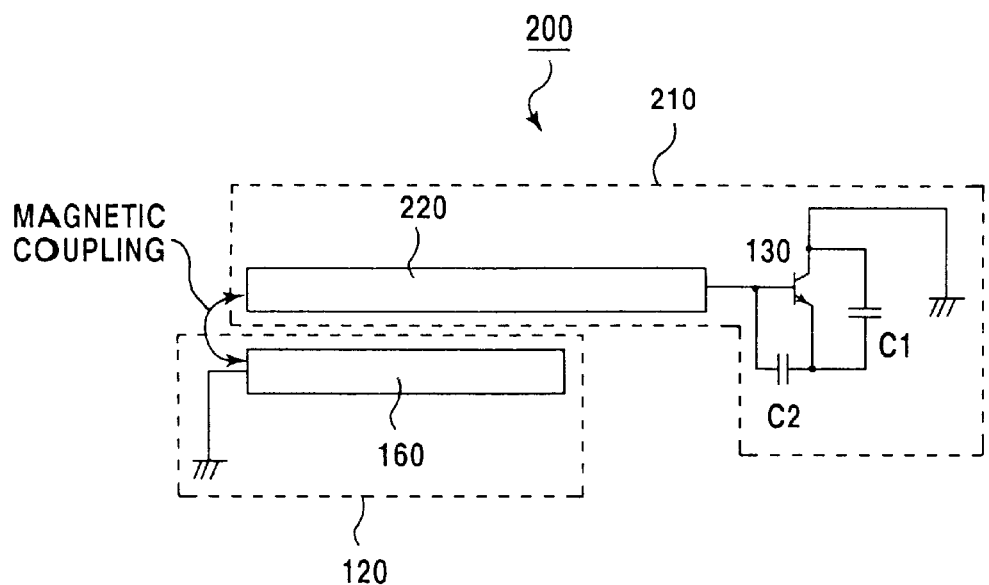
FIG. 9 shows a circuit configuration of a fourth exemplary embodiment, relat ing to the oscillator of the present invention.

FIG. 9 shows the circuit configuration of the fourth embodiment relating to the present invention. The oscillation apparatus 200 comprises an oscillator 210 and a resonator 120.

In the oscillator 210, an oscillation transistor 130, such as a silicon bipolar transistor, is arranged on, for example, a dielectric substrate (not illustrated), and a half-wave open-circuit terminal stub 220 comprising the open-circuit terminal stub is connected to the base of the oscillation transistor 130.

Further, the collector of the oscillation transistor 130 is grounded, and the emitter of the oscillation transistor 130 is connected to the collector and base through the feedback capacitances C1 and C2, respectively.

Further, the magnetic coupling of the half-wave open-circuit terminal stub 220 of the oscillator 210 and the quarter-wave short-circuit terminal stub 160 of the resonator 120 results in the magnetic coupling of the oscillator 210 and the resonator 120.

In this case, the half-wave open-circuit terminal stub 220 of the oscillator 210 which is open from the standpoint of distributed constants becomes a resonator. That is, the oscillation apparatus 200 comprises the quarter-wave short-circuit terminal stub 160 of the resonator 120 magnetically coupled to the resonator 220 of the oscillator 210.

Moreover, the half-wave open-circuit terminal stub 220 of the oscillator 210 can comprise a stripline or microstripline. Furthermore, the internal and stray capacitance of the oscillation transistor 130 can be substituted for the feedback capacitances C1 and C2 between the emitter and collector and between the emitter and base, respectively, of the oscillation transistor 130. This is because very small feedback capacitances C1 and C2 suffice, for example, at high frequencies (e.g., around 6 GHz) where the oscillator 200 is used, and accordingly the capacitances are not generally formed as external components.

According to the oscillator of the present invention, because the oscillator comprises an oscillation transistor, a quarter-wave open-circuit terminal stub, and a capacitor, it is possible to make the oscillator small-sized.

Also, because the capacitor has a resonance frequency lower than the oscillation frequency, the capacitor functions as a component of inductance beyond the resonance frequency, and as a result, the oscillator becomes of a Colpitts-type oscillator. Therefore, the oscillator is made such that it can easily generate oscillation at the frequency where the composite inductance of the oscillator equals zero.

According to the oscillator of the present invention, because a high-impedance line is added in series with the capacitor connected between the collector of the transistor and the ground, the adjustment of the length of the high-impedance line makes it easier to optimize the composite impedance of the quarter-wave open-circuit terminal stub, the capacitor, and the high-impedance line. Therefore, the adjustment of the oscillation frequency becomes simpler.

According to the oscillation apparatus of the present invention, the oscillator and the resonator are magnetically coupled, and by changing the strength of the magnetic coupling, the oscillation frequency of the oscillation apparatus can be controlled.

Moreover, because the resonator resonates under nearly no-load conditions, the C/N ratio of the oscillation apparatus can be improved, and accordingly a higher C/N ratio can be realized.

Based on the construction of the above-mentioned embodiments, the magnetic coupling of the oscillator 10 or the oscillator 210 to the resonators 31 and 120, respectively, makes the oscillator 11 or the oscillator 210 resonate with the resonators 31 and 120, and therefore the resonators 31 and 120 can be made to resonate under nearly no-load conditions. As a result, a high C/N ratio nearly equal to that in the past can be obtained.

That is, according to one experiment, the apparatus 30 and 200 at the oscillation frequency of 6 GHz exhibit a high C/N ratio of −90.8 dB, which is almost equal to that of the conventional oscillator 50 using a dielectric resonator 50.

Figure 10:
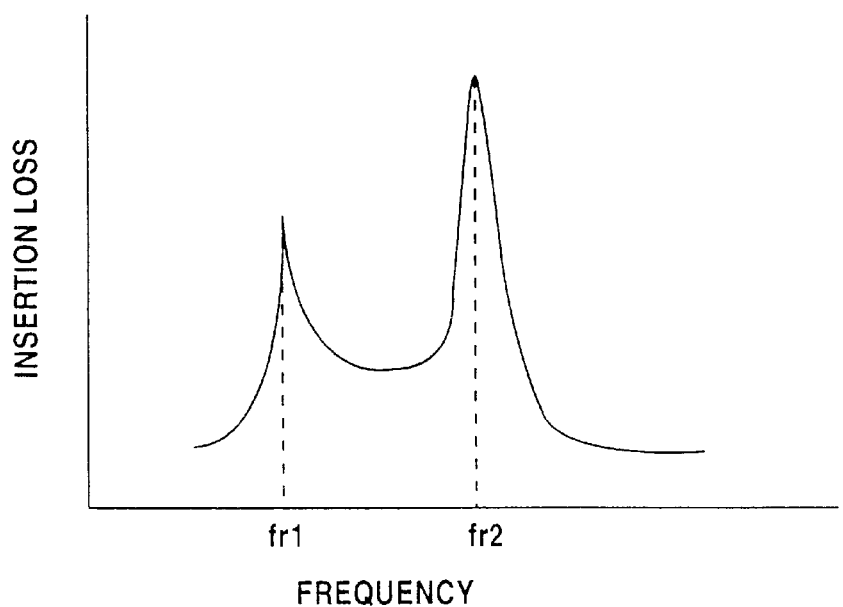
FIG. 10 shows the frequency characteristic of the oscillator in FIG. 9.

Also, in the oscillation apparatus 30 and 200, as the oscillator 10 or the oscillator 210 is made to magnetically couple with the resonators 31 and 120, respectively, the oscillator 10 or the oscillator 210 resonates with the resonators 31 and 120, respectively. As a consequence, the apparatus 30 and 200 have two resonance frequencies $f_{r1}$ and $f_{r2}$ as shown in FIG. 10.

These resonance frequencies $f_{r1}$ and $f_{r2}$ change in accordance with the strength of the magnetic coupling of the oscillator 10 or the oscillator 210 with the resonators 31 and 120, respectively, and the oscillation apparatus 30 and 200 generate oscillation at either of the resonance frequencies $f_{r1}$ and $f_{r2}$.

Thereof, by changing the strength of the magnetic coupling of the oscillator 30 or the oscillator 210 with the resonators 31 and 120, respectively, the oscillation frequency of the oscillation apparatus 30 and 200 can be easily altered.

According to the above-mentioned embodiments, as the oscillation apparatus comprises an oscillation transistor, a quarter-wave open-circuit terminal stub or a half-wave open-circuit terminal stub, and a quarter-wave short-circuit terminal stub, the oscillation apparatus can be made to have a small size. In particular, as in case of the first embodiment, the use of a quarter-wave open-circuit terminal stub as the open-circuit terminal stub makes it possible to realize a smaller-sized oscillation apparatus because the open-circuit terminal stub is shortened.

Also, because the resonator resonates under nearly no-load conditions, the oscillator is able to have a high C/N ratio nearly equal to that of the conventional oscillator using a dielectric resonator. Therefore, the oscillator can meet the requirement of a high C/N ratio and can be made small-sized at the same time.

Further, magnetic coupling of the oscillator and the resonator and then changing the strength of the magnetic coupling makes it possible to control the oscillation frequency.

In addition, in the above embodiments, bipolar transistors are used, but the use of field-effect transistors having an open-circuit terminal stub connected thereto gives the same effect.

Moreover, in the above embodiments, magnetic coupling was provided with an open-circuit terminal stub and a quarter-wave short-circuit terminal stub, but a plurality of open-circuit terminal stubs and quarter-wave short-circuit terminal stubs can be used, e.g., having a comb-like configuration. In this embodiment, three or more resonance frequencies can be provided and the stability of the oscillation frequency is increased.

Furthermore, an oscillation apparatus made up of an oscillator formed on a material of voltage-variable dielectric constant can be applied to the voltage-controlled oscillator.

The oscillation apparatus of the present invention comprises the oscillator made up of an oscillation transistor and an open-circuit terminal stub, and the resonator of a quarter-wave short-circuit terminal stub, and accordingly the apparatus can be made having a small size.

Also, because the resonator comprising the oscillation apparatus resonates under nearly no-load conditions, the oscillator is able to have a high C/N ratio nearly equal to that of the conventional oscillator using a dielectric resonator. Therefore, the oscillator can meet the requirement of a high C/N ratio and be made small-sized at the same time.

Moreover, the magnetic coupling of the oscillator and the resonator, and the change of the strength of the magnetic coupling make it possible to control the oscillation frequency.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An oscillator, comprising:
   an oscillation transistor having a base, collector and emitter;
   a quarter-wave open-circuit terminal stub connected to the base of said oscillation transistor; and
   a capacitor, connected between the collector of said oscillation transistor and a fixed potential, having a capacitance value which provides a resonance frequency in said connection which is lower than the oscillation frequency of the oscillator.

2. An oscillator according to claim 1, wherein a high-impedance line is connected in series to said capacitor.

3. An oscillator according to claim 1, wherein said oscillation transistor is one of: a bipolar transistor; and a field-effect transistor.

4. An oscillator according to claim 1, wherein said emitter of the oscillation transistor is connected to the collector and the base through first and second feedback capacitors, respectively.

5. An oscillator according to claim 4, wherein said first and second feedback capacitors are formed by internal and stray capacitance of the oscillation transistor.

6. An oscillator according to claim 1, wherein said quarter-wave open-circuit terminal stub comprises a stripline.

7. An oscillator according to claim 1, wherein said quarter-wave open-circuit terminal stub is grounded from the standpoint of distributed constants, thereby becoming an earth wire.

8. An oscillation apparatus, comprising:
   an oscillator, which comprises:
      an oscillation transistor having a base, collector and emitter;
      an open-circuit terminal stub connected to the base of said oscillation transistor; and
      a capacitor providing a resonance frequency lower than the oscillation frequency of the oscillator, connected to the collector of said oscillation transistor; and
   a resonator containing a quarter-wave short-circuit terminal stub;
   wherein said oscillator and said resonator are magnetically coupled together.

9. An oscillation apparatus according to claim 8, wherein a high-impedance line is connected in series to said capacitor.

10. An oscillation apparatus according to claim 8, wherein said emitter of the oscillation transistor is connected to the collector and the base through first and second feedback capacitors, respectively.

11. An oscillation apparatus according to claim 8, wherein said open-circuit terminal stub and said quarter-wave short-circuit terminal stub comprise striplines.

12. An oscillation apparatus according to claim 8, wherein said open-circuit terminal stub comprises a quarter-wave open-circuit terminal stub.

13. An oscillation apparatus according to claim 8, wherein said open-circuit terminal stub comprises a half-wave open-circuit terminal stub.

14. An oscillation apparatus according to claim 8, further including an oscillation frequency regulating circuit which is magnetically coupled with said resonator.

15. An oscillation apparatus according to claim 14, wherein said oscillation frequency regulating circuit comprises a quarter-wave open-circuit terminal stub which is magnetically coupled with said quarter-wave short-circuit terminal stub of the resonator.

16. An oscillator apparatus according to claim 14, wherein said oscillation frequency regulating circuit comprises an element having voltage-variable capacitance.

17. An oscillator apparatus according to claim 16, wherein said element having voltage-variable capacitance is a varactor diode.

18. An oscillator apparatus according to claim 8, further including a plurality of open-circuit terminal stubs and a plurality of quarter-wave short-circuit terminal stubs.

19. An oscillator apparatus according to claim 18, wherein said plurality of open-circuit and short-circuit terminal stubs are magnetically coupled in a comb-like configuration.

* * * * *